US009329626B2

(12) United States Patent  
Saito et al.

(10) Patent No.: US 9,329,626 B2  
(45) Date of Patent: May 3, 2016

(54) HIGH-DENSITY SERVER AGGREGATING EXTERNAL WIRES FOR SERVER MODULES

(71) Applicant: NEC Corporation, Minato-ku, Tokyo (JP)

(72) Inventors: Tadashi Saito, Tokyo (JP); Toshiyuki Hayashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 217 days.

(21) Appl. No.: 13/936,317

(22) Filed: Jul. 8, 2013

(65) Prior Publication Data  
US 2014/0016265 A1 Jan. 16, 2014

(30) Foreign Application Priority Data

Jul. 12, 2012 (JP) .................................. 2012-157011

(51) Int. Cl.  
H05K 7/20 (2006.01)  
G06F 1/16 (2006.01)  
(Continued)

(52) U.S. Cl.  
CPC .... *G06F 1/16* (2013.01); *G06F 1/183* (2013.01); *G06F 1/189* (2013.01); *G06F 1/20* (2013.01); *H05K 7/1487* (2013.01); *H05K 7/20727* (2013.01)

(58) Field of Classification Search  
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467  
USPC ........................ 361/676–678, 679.46–679.54, 361/688–723, 724–727; 165/80.1–80.5, 165/104.33, 185; 174/15.1–15.3, 174/16.1–16.3, 547, 548; 257/712–722, 257/E23.088; 24/453, 458–459; 454/184  
See application file for complete search history.

(56) References Cited

U.S. PATENT DOCUMENTS 5,949,645 A * 9/1999 Aziz .................... H05K 7/1421  
165/104.33  
6,246,580 B1 * 6/2001 Weng ........................ G06F 1/18  
174/16.1

(Continued)

FOREIGN PATENT DOCUMENTS

JP 2007-52573 A 3/2007  
JP 2007-128498 A 5/2007  
(Continued)

OTHER PUBLICATIONS

"HP ProLiant SL6500 Scalable System technologies", Hewlet-Packard Development Company, L.P., TC101217TB, Dec. 2010, pp. 1-13. Browsed via the internet at URL <http://h20000.www2.hp.com/bc/docs/support/SupportManual/c02664768/c02664768.pdf>.

(Continued)

Primary Examiner — Anthony Haughton  
Assistant Examiner — Razmeen Gafur

(57) ABSTRACT

A high-density server includes a plurality of server enclosures, each of which includes an enclosure frame with a pair of front decks and a rear opening, an enclosure element having a power supply unit, and a pair of server modules having module connectors. The enclosure element is positioned in the rear side of the enclosure frame. The module connector of the server module is detachably connected to the front connector of the power supply unit when the server module moves along the front deck in an insertable/removable manner inside the enclosure frame. A cooling fan is positioned in the front side of the server module relative to the rear opening of the enclosure frame. An external interface is attached to the rear end of the server module or installed in the enclosure element, thus preventing a mess in the front face of the server enclosure due to external wires.

20 Claims, 13 Drawing Sheets

(51) Int. Cl.
*G06F 1/20* (2006.01)
*G06F 1/18* (2006.01)
*H05K 7/14* (2006.01)
H01L 23/473 (2006.01)

(56) References Cited

U.S. PATENT DOCUMENTS

| | | | | |
|---|---|---|---|---|
| 7,916,471 B2 * | 3/2011 | Miyamoto | ............ | G11B 33/128 361/679.31 |
| 8,014,144 B2 | 9/2011 | Cheng et al. | | |
| 8,116,078 B2 * | 2/2012 | Xu | ............ | G06F 1/181 345/502 |
| 8,720,532 B2 * | 5/2014 | Malone | ............ | H05K 7/20727 165/121 |
| 2001/0046118 A1 * | 11/2001 | Yamanashi | ............ | G06F 1/20 361/679.33 |
| 2002/0134531 A1 * | 9/2002 | Yanagida | ............ | G06F 1/18 165/80.3 |
| 2003/0048607 A1 * | 3/2003 | Ives | ............ | G11B 33/08 361/695 |
| 2004/0062002 A1 * | 4/2004 | Barringer | ............ | G06F 1/18 361/679.4 |
| 2004/0184233 A1 * | 9/2004 | Yamada | ............ | H05K 7/20572 361/690 |
| 2004/0257762 A1 * | 12/2004 | Shih | ............ | G06F 1/183 361/679.48 |
| 2005/0135059 A1 * | 6/2005 | Araki | ............ | H05K 7/1487 361/690 |
| 2006/0056142 A1 * | 3/2006 | Takahashi | ............ | G06F 1/30 361/679.33 |
| 2007/0097616 A1 * | 5/2007 | Su | ............ | G06F 1/187 361/679.31 |
| 2008/0043427 A1 * | 2/2008 | Lee | ............ | G06F 1/1601 361/679.48 |
| 2008/0068793 A1 * | 3/2008 | Ishimine | ............ | G06F 1/206 361/688 |
| 2008/0180925 A1 | 7/2008 | McClure et al. | | |
| 2009/0135558 A1 * | 5/2009 | Hughes | ............ | H05K 7/20727 361/679.46 |
| 2009/0231803 A1 * | 9/2009 | Chang | ............ | H05K 7/1487 361/679.47 |
| 2009/0244828 A1 * | 10/2009 | Engert | ............ | G06F 1/20 361/679.47 |
| 2010/0073866 A1 * | 3/2010 | Toyoda | ............ | F28D 15/043 361/679.47 |
| 2010/0265645 A1 * | 10/2010 | Wang | ............ | G06F 1/183 361/679.4 |
| 2010/0265650 A1 | 10/2010 | Chen et al. | | |
| 2011/0043994 A1 * | 2/2011 | Cheng | ............ | G06F 1/187 361/679.33 |
| 2011/0116226 A1 * | 5/2011 | Yang | ............ | H05K 7/1487 361/679.48 |
| 2011/0261526 A1 * | 10/2011 | Atkins | ............ | G06F 1/187 361/379.33 |
| 2011/0317363 A1 * | 12/2011 | Sun | ............ | G06F 1/20 361/695 |

FOREIGN PATENT DOCUMENTS

| | | |
|---|---|---|
| JP | 2008-003737 A | 1/2008 |
| JP | 2009-169874 A | 7/2009 |
| JP | 2011-039920 A | 2/2011 |
| JP | 2012-79318 A | 4/2012 |

OTHER PUBLICATIONS

"TYAN YR190-B7018 Service Engineer's Manual", MiTAC International Corporation, Version 1.1, Doc No. D2023-110, 2012, pp. 1-64. Browsed via the internet at URL <http://www.tyan.com/manuals/B7018Y190X2_UG_v1.1a.pdf>.

"PowerEdge C6100 Rack Server" (written in Japanese), DELL Inc., retrieved on May 14, 2013, Browsed via the internet at URL <http://www.dell.com/jp/enterprise/p/poweredge-c6100/pd>, Concise English language explanation found in Applicant's specification as Non-Patent Literature 3.

"PowerEdge C6100 Rack Server" (written in English), DELL Inc., retrieved on May 14, 2013, Browsed via the internet at URL <http://www.dell.com/us/enterprise/p/poweredge-c6100/pd>.

Japanese Office Action for JP Application No. 2012-157011 mailed on Apr. 25, 2014 with partial English Translation.

Japanese Office Action for JP Application No. 2012-157011 mailed on Oct. 1, 2013 with English Translation.

* cited by examiner

FIG. 11A
FIG. 11B
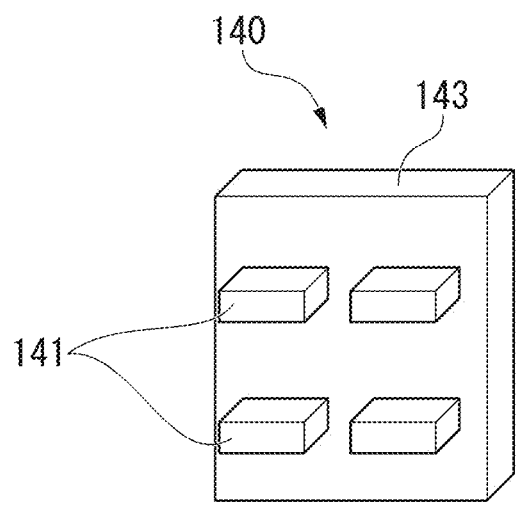
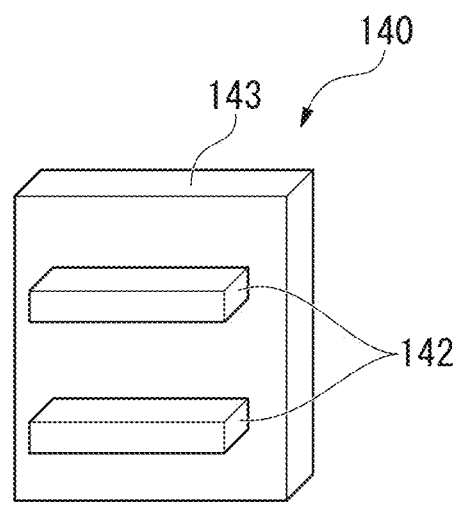
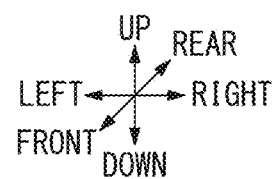
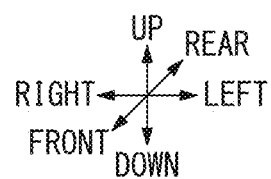

HIGH-DENSITY SERVER AGGREGATING EXTERNAL WIRES FOR SERVER MODULES

BACKGROUND OF THE INVENTION

1. Field of the Invention

The present invention relates to a high-density server including a plurality of server modules with external interfaces aggregating external wires connected to external devices.

The present application claims priority on Japanese Patent Application No. 2012-157011 filed Jul. 12, 2012, the entire content of which is incorporated herein by reference.

2. Description of the Related Art

Conventionally, high-density servers are each designed to include a plurality of server enclosures, each enclosing a plurality of server modules. Specifically, high-density servers are each designed to include a server rack accommodating a plurality of enclosure drawers which are vertically combined together. A plurality of server enclosures is individually put into enclosure drawers installed in a server rack such that server enclosures can be freely inserted into or pulled out from enclosure drawers. A plurality of server enclosures is cast into an enclosure frame accommodating a plurality of front drawers which are arranged vertically and horizontally. A plurality of server modules is individually put into a plurality of front drawers, arranged inside an enclosure frame, such that server modules can be freely inserted into or pulled out from front drawers. Each server module may include a CPU and/or an HDD (Hard Disk Drive) unit.

As described above, a high-density server may install a plurality of server modules therein, thus implementing parallel processing and complex computation with a plurality of server modules. Each server module needs electrical power which inevitably causes high heat during computation. For this reason, a high-density server requires a power source unit and cooling fans in server enclosures.

Patent Literature 1 discloses a server monitoring system including a power source, motherboards, controllers, and fans. Patent Literature 2 discloses a blade server system including server blades and power source devices. Patent Literature 3 discloses a blade server arranging a hard-disk drive (HDD), which can be inserted into or pulled out from housing, independently of server modules. Patent Literature 4 discloses a computer system having a rack accommodating server modules without using cables.

Additionally, Non-Patent Literature 1 discloses a scalable computing system accommodating a plurality of server drawers in a specially-designed chassis. Non-Patent Literature 2 discloses a rack-mountable barebone configuration of a server system offering scalable computation. Non-Patent Literature 3 (i.e. a Japanese webpage) discloses a rack server with a rack chassis offering a high density of servers and reducing power consumption. Non-Patent Literature 4 is an English-language webpage corresponding to Non-Patent Literature 3.

Patent Literatures 1 to 4 teach various examples of servers each accommodating a plurality of server nodes (i.e. drawers and chassis) in which a power source is interposed between server drawers and positioned opposite to a connecting node of a motherboard. Non-Patent Literature 1 teaches an example of a server layout in which a power source unit and cooling fans are arranged in a rear opening formed at a rear portion of an server enclosure. Herein, it is necessary to arrange external interfaces, such as an I/O port, a LAN connector, or a PCI (Peripheral Component Interconnect) slot, as well as a HDD unit and an operation panel in the front face of a server module. This allows users to easily access a HDD unit and an operation panel on the front face of a sever enclosure, collectively aggregating external wires which can be freely connected to or disconnected from external interfaces. Non-Patent Literatures 2-4 teach various configurations of servers similar to Non-Patent Literature 1.

As described above, Non-Patent Literature 1 teaches a sever system in which a power source unit and cooling fans are arranged on the rear face of a server enclosure while external interfaces are arranged on the front face of a server module. This technology needs to collectively aggregate external wires, connected to external interfaces, on the front face. However, this may cause a mess in the front face of a server enclosure aggregating external wires connected to external interfaces. In other words, external wires connected to external interfaces may physically block users from accessing a HDD unit and an operation panel.

CITATION LIST

Patent Literature

Patent Literature 1: Japanese Patent Application Publication No. 2011-039920
Patent Literature 2: Japanese Patent Application Publication No. 2009-169874
Patent Literature 3: Japanese Patent Application Publication No. 2008-003737
Patent Literature 4: Japanese Patent Application Publication No. 2007-128498

Non Patent Literature

Non-Patent Literature 1: "HP ProLiant SL6500 Scalable System technologies", browsed via the Internet at URL "http://h20000.www2.hp.com/bc/docs/support/SupportManual/c02664768/c02664768.pdf"
Non-Patent Literature 2: "TYAN YR190-B7018 Service Engineer's Manual", browsed via the Internet at URL http://www.tyan.com/manuals/B7018Y190X2_UG_v1.1a.pdf
Non-Patent Literature 3: "PowerEdge C6100 Rack Server" (written in Japanese), browsed via the Internet at URL "http://www.dell.com/jp/enterprise/p/poweredge-c6100/pd#"
Non-Patent Literature 4: "PowerEdge C6100 Rack Server" (written in English), browsed via the Internet at URL "http://www.dell.com/us/business/p/poweredge-c6100/pd"

SUMMARY OF THE INVENTION

It is an object of the present invention to provide a high-density server including a plurality of server modules with external interfaces aggregating external wires connected to external devices. In particular, the present invention aims to provide users with easy and free access to any devices and consoles installed in a high-density server.

The present invention is directed to a server enclosure including an enclosure frame having a pair of front drawers with a front opening and a rear opening, an enclosure element which is positioned in the rear side of the enclosure frame and interposed between a pair of front drawers, and a pair of server modules mounted on a pair of front drawers in an insertable/removable manner inside the enclosure frame. The enclosure element includes a power supply unit which is positioned in the rear side of the enclosure frame and a front connector which is electrically connected to the power supply unit. A pair of server modules is each allowed to move along the front drawer in the front-rear direction. The server module includes a computer unit, a module connector, and a cooling fan. The computer unit operates based on electrical power from the power supply unit. The module connector is positioned in the rear side of the server module and electrically connected to the computer unit. The module connector is detachably connected to the front connector as the server module is moved along the front drawer in the front-rear direction. The cooling fan is positioned in the front side of the server module relative to the rear opening of the enclosure frame.

The present invention is directed to a server module adapted to a server enclosure including an enclosure frame with a front drawer, a front opening, and a rear opening, and an enclosure element including a power supply unit, a front connector, and a rear connector. The server module includes a computer unit and a module connector. The computer unit operates based on electrical power of the power supply unit. The module connector is electrically connected to the power supply unit. The module connector of the server module is detachably connected to the front connector of the power supply unit when the server module is inserted into or pulled out from the enclosure frame along the front drawer in the front-rear direction.

The present invention is directed to an enclosure element adapted to a server enclosure including an enclosure frame with a front drawer, a front opening, and a rear opening, and a server module including a computer unit and a module connector. The enclosure element includes a power supply unit and a front connector. The front connector is electrically connected to the power supply unit and detachably connected to the module connector of the server module which is inserted into or pulled out along the front drawer from the enclosure frame.

The present invention is directed to a high-density server including a server rack including a plurality of enclosure drawers, and a plurality of server enclosures which is mounted on a plurality of enclosure drawers in an insertable/removable manner and each of which includes an enclosure frame, a pair of server modules, and an enclosure element.

In the above, the enclosure element may include an external interface which is positioned in proximity to the rear opening of the enclosure frame. Additionally, the enclosure element may include a pair of power supply units, a pair of front connectors, a pair of rear connectors, and a power distribution unit. The power distribution unit establishes redundant multiple connections between a pair of front connectors and a pair of rear connectors in connection with a pair of power supply units.

The server enclosure of the present invention does not need to arrange an external interface (e.g. an I/O port) on the front face of the server module, thus preventing a mess in the front face of the server module due to external wires. Thus, it is possible to reliably prevent external wires, connected to an external interface, from hindering users' access to various components (e.g. HDD units and an operation panel) which need maintenance work and manual operation.

BRIEF DESCRIPTION OF THE DRAWINGS

These and other objects, aspects, and embodiments of the present invention will be described in more detail with reference to the following drawings.

FIG. 11A is a perspective view showing the front side of a power distribution unit adapted to a variation of the server enclosure.

FIG. 11B is a perspective view showing the rear side of a power distribution unit adapted to a variation of the server enclosure.

DESCRIPTION OF THE PREFERRED EMBODIMENTS

The present invention will be described in further detail by way of examples with reference to the accompanying drawings.

1. First Embodiment

Figure 1:
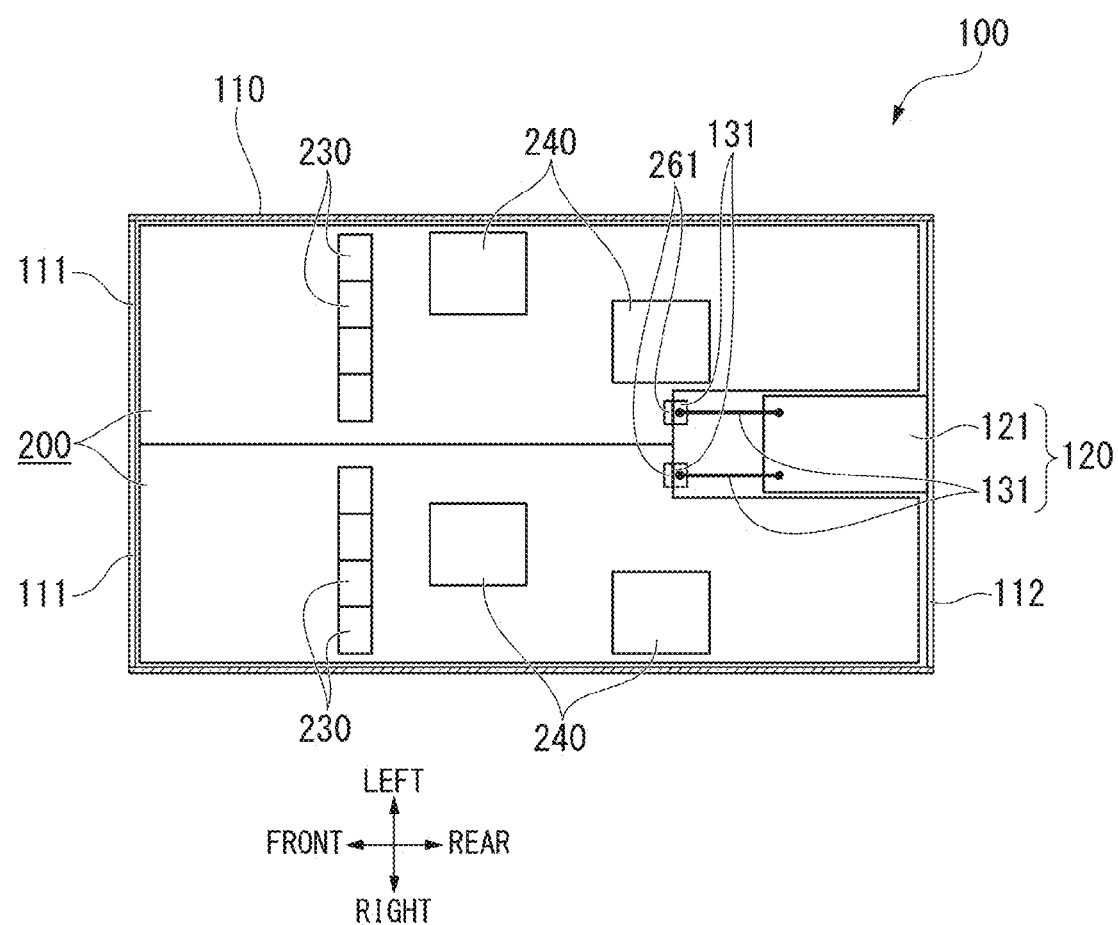
FIG. 1 is a plan view of a server enclosure accommodating a pair of server modules mountable on a pair of front drawers according to a first embodiment of the present invention.

FIG. 1 is a plan view of a server enclosure 100 accommodating a pair of server modules 200 mountable on a pair of front drawers 111. The server enclosure 100 includes an enclosure frame 110, a power supply unit 121 (serving as a power source unit), font connectors 131, an enclosure element 120, module connectors 261, server modules 200, cooling fans 230, and a computer unit 240. The enclosure frame 110 includes a pair of front drawers 111 (or front openings) and a rear opening 112. The power supply unit 121 is positioned inside the enclosure frame 110. The front connectors 131 electrically conduct to the power supply unit 121.

The server module 200 installs the cooling fans 230 and the computer unit 240 therein while arranging the module connector 261 in the rear side thereof. The server module 200 is mountable on the front drawer 111 and movable in the front-rear direction such that the server module 200 can be inserted into or pulled out from the front drawer 111. The cooling fans 230 are arranged in the front side of the server module 200, mounted on the front drawer 111, opposite to the rear opening 112 of the enclosure frame 110. The cooling fans 230 operate based on electrical power of the power supply unit 121. The computer unit 240 is configured of a one-chip microcomputer with a CPU. The computer unit operates based on electrical power of the power supply unit 121. The module connector 261 is electrically connected to the cooling fans 230 and the computer unit 240 and is detachably attached to the front connector 131. The server enclosure 100 ensures movability of the server module 200 on the front drawer 111 in the front-rear direction in an insertable/removable manner, and therefore the module connector 261 of the server module 200 is detachably connected to the front connector 131 of the enclosure element 120 which is positioned in the rear side of the front drawer 111 in the enclosure frame 110. In this connection, the server enclosure 100 does not arrange the cooling fans 230 in the rear opening 112 thereof. Additionally, the server module 200 does not need to arrange any external interface (not shown) in the front face thereof.

Due to this configuration, it is possible to arrange external interfaces in the rear end of the server modules 200. This prevents a mess in the front face of the server module 100 due to external wires, connected to external interfaces, which may block users from accessing an HDD unit and an operation panel. Additionally, a plurality of server modules 200 is not necessarily equipped with their individual power supply units, which may substantially reduce the effective area for the server modules 200. In other words, the server enclosure 100 needs to install a single large-size power supply unit 121, shared by a plurality of server modules 200, therein. Moreover, the power supply unit 121 is positioned in the rear end of the enclosure frame 110 while the server modules 200 are mounted in an insertable/removable manner on the front drawers 111 in the enclosure frame 110. This allows users to carry out maintenance work on the server modules 200, which can be easily inserted into or pulled out from the server enclosure 100.

2. Second Embodiment

Figure 2:
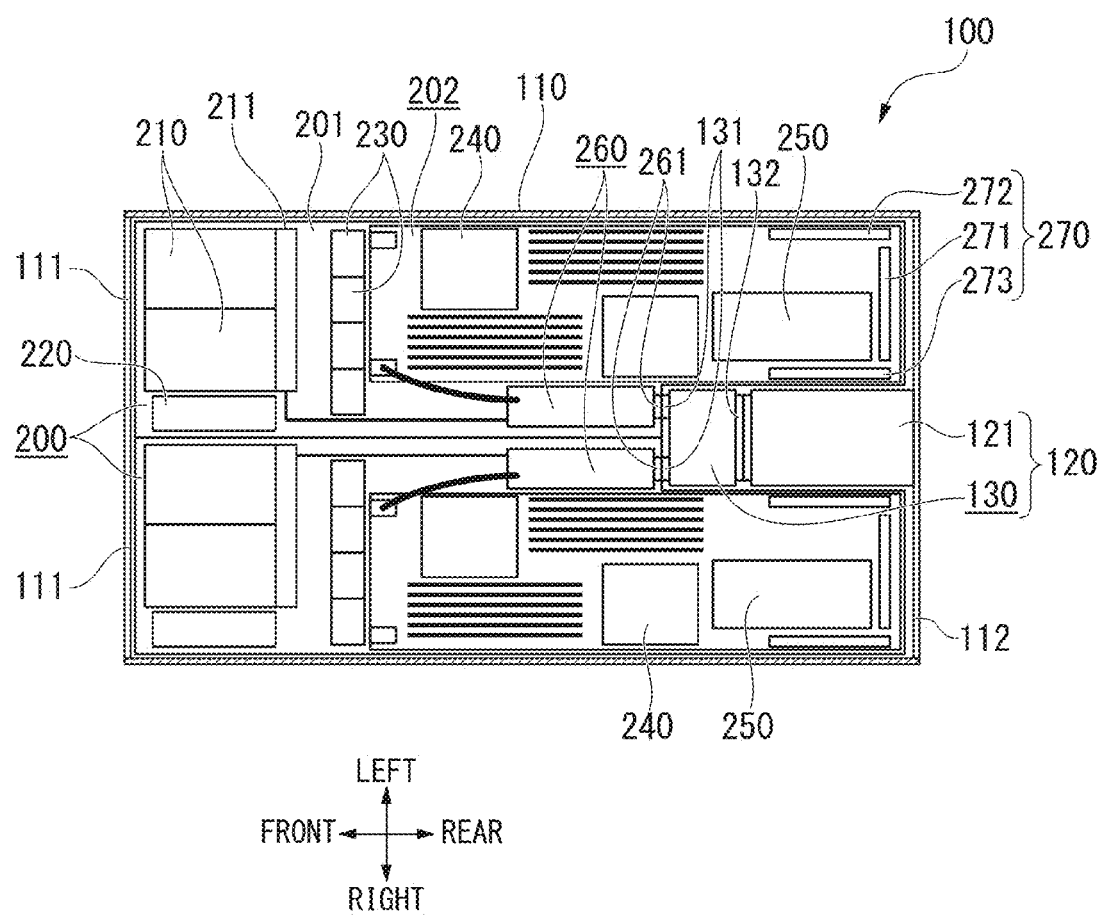
FIG. 2 is a plan view of a server enclosure accommodating a pair of server modules mountable on a pair of front drawers according to a second embodiment of the present invention.
Figure 3:
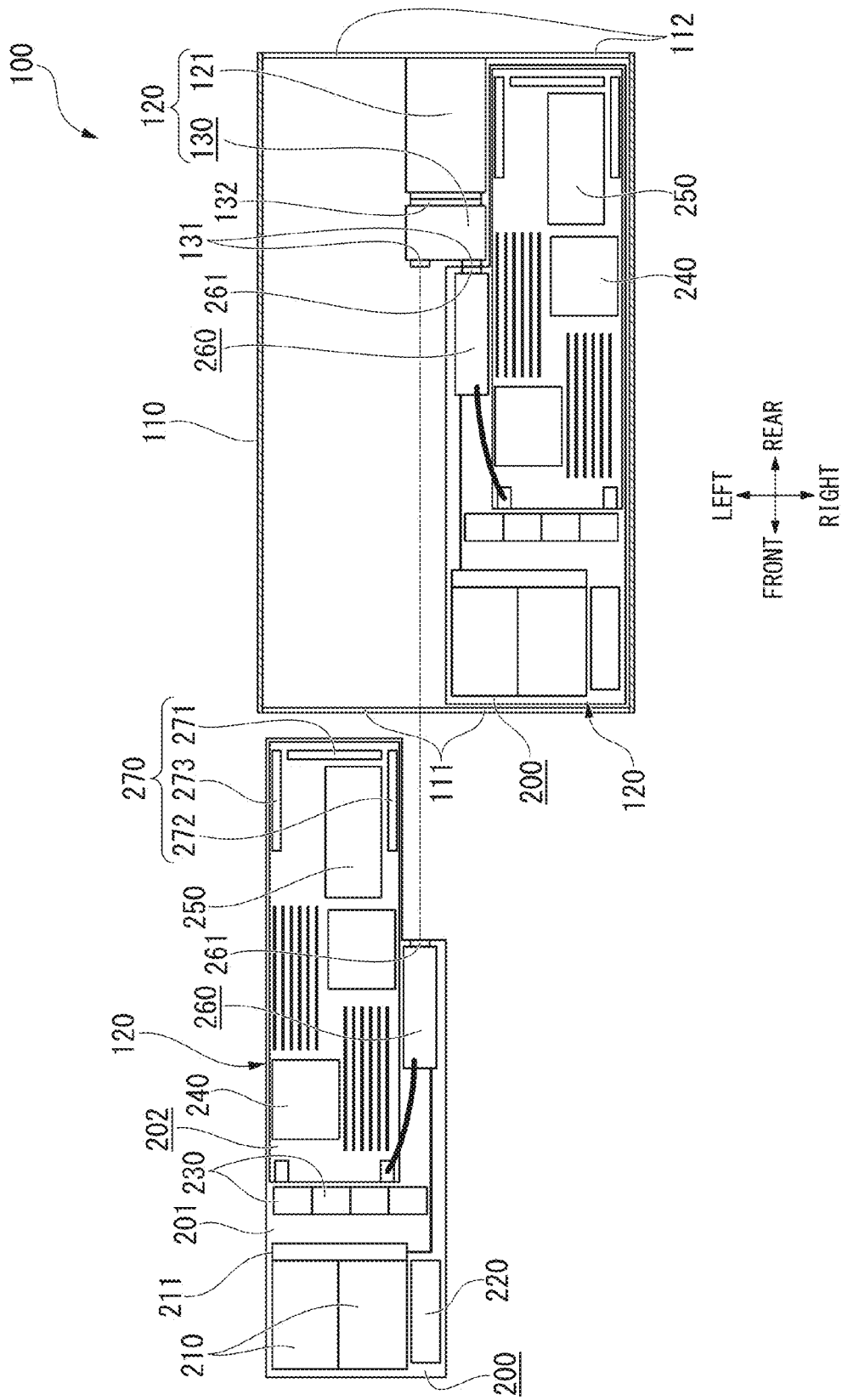
FIG. 3 is a plan view of the server enclosure including one server module while precluding another server module which is being horizontally extracted therefrom.
Figure 4:
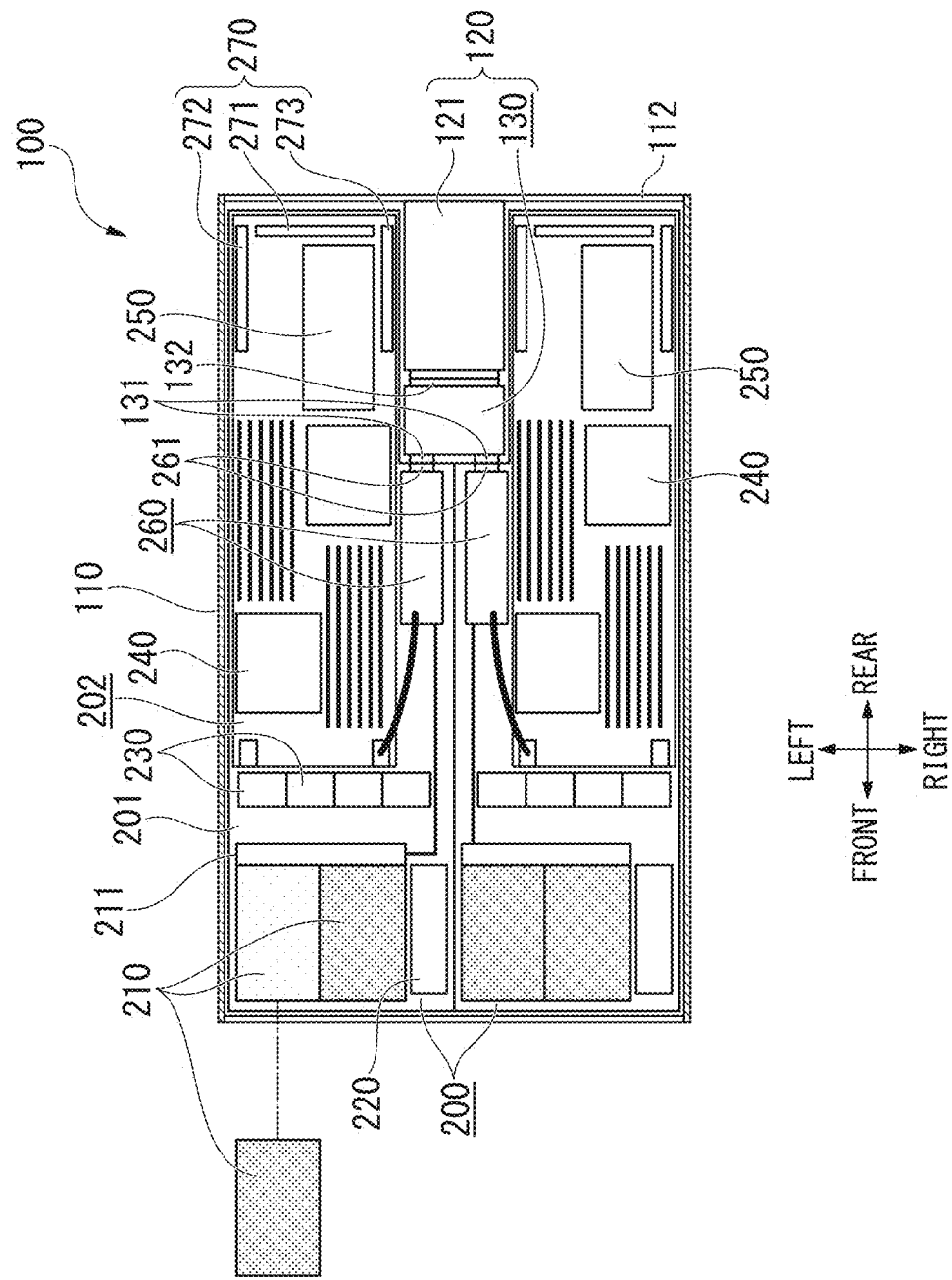
FIG. 4 is a plan view of the server enclosure including a pair of server modules, in which one HDD unit is being extracted from one server module.
Figure 5:
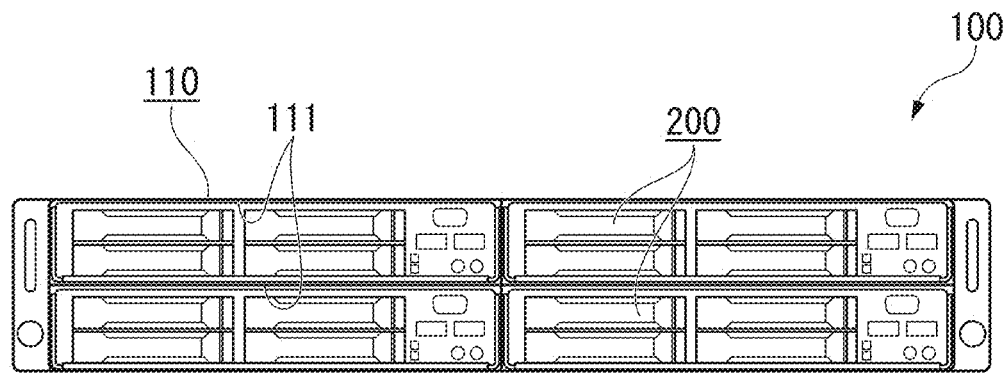
FIG. 5 is a front view of the server enclosure including two pairs of server modules mounted on two pairs of four front drawers which are allocated to upper and lower stages vertically combined together.
Figure 5:
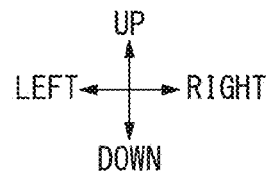
Figure 6:
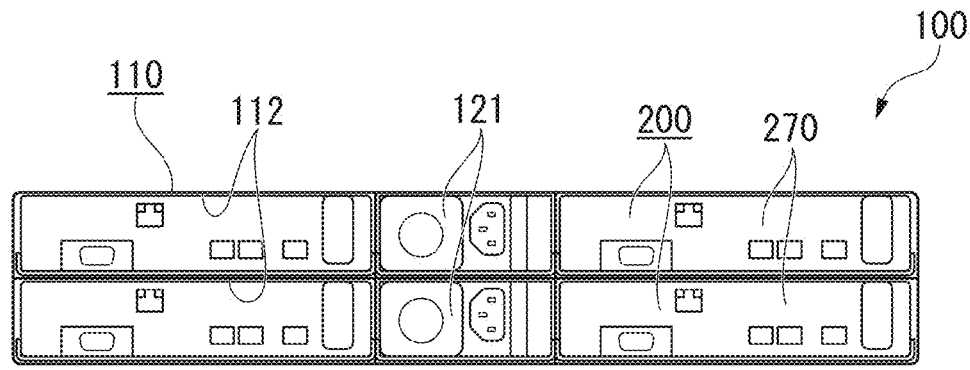
FIG. 6 is a rear view of the serve enclosure including two pairs of server modules mounted on two pairs of front drawers.
Figure 6:
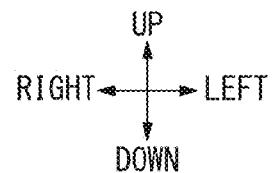
Figure 7:
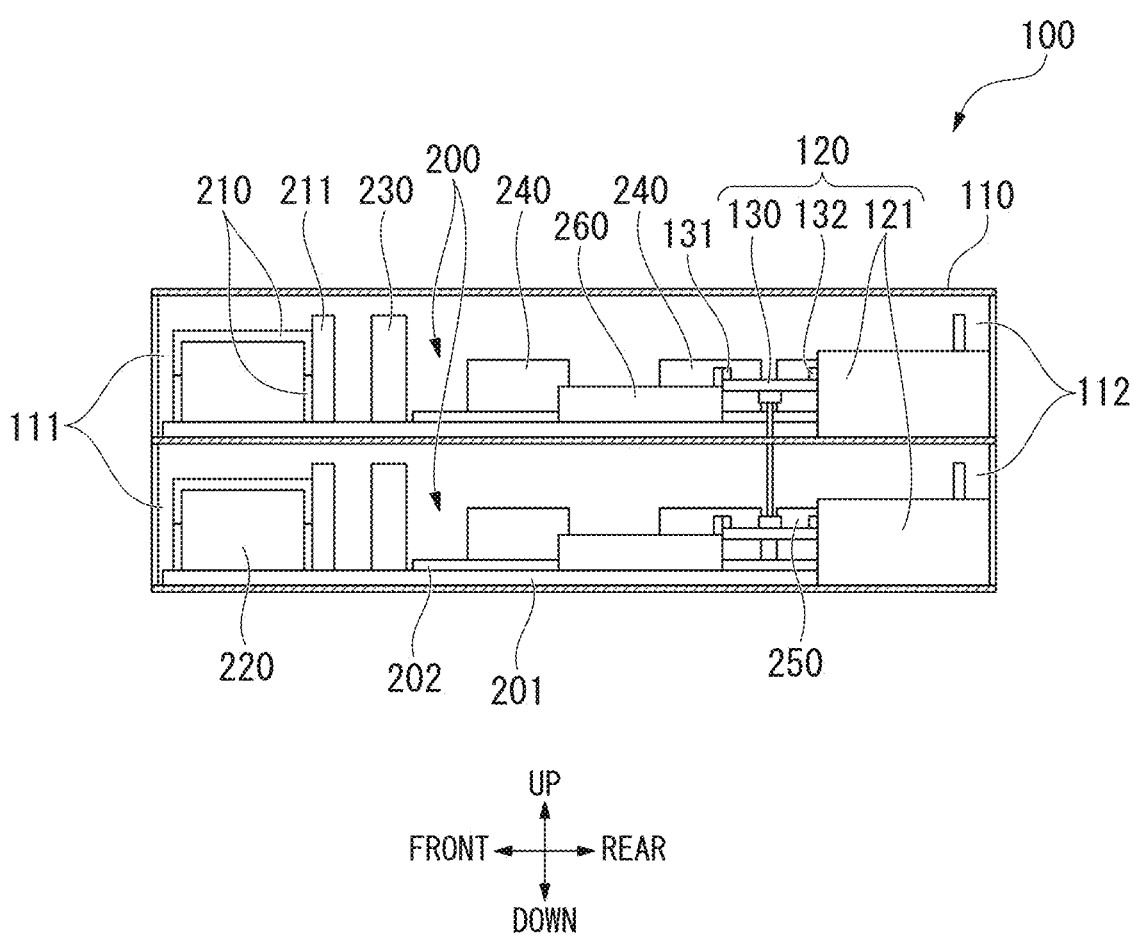
FIG. 7 a side view of the server enclosure including a pair of server modules mounted on a pair of front drawers which are vertically combined together.
Figure 8:
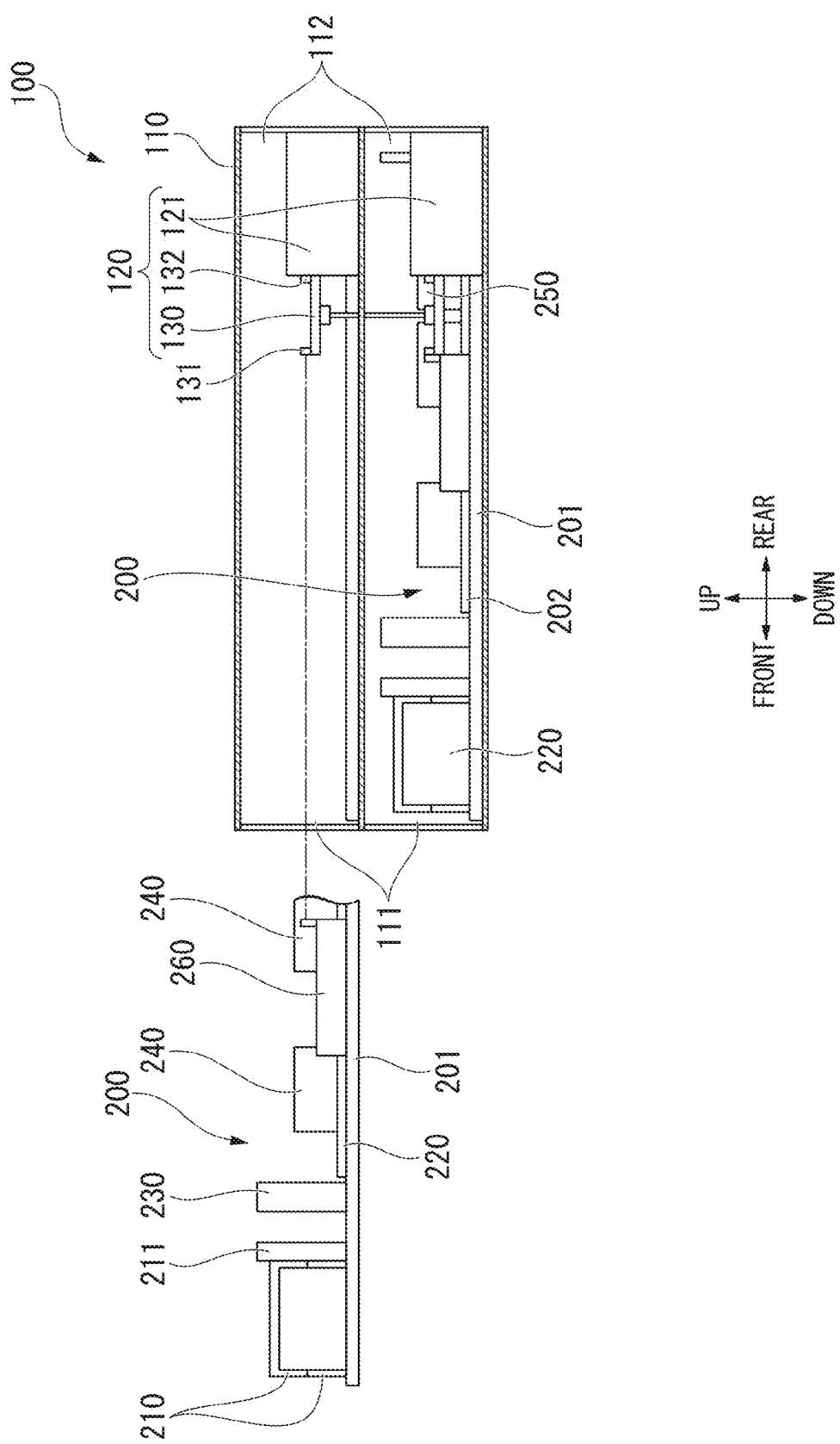
FIG. 8 is a side view of the server enclosure including one server module on the lower stage while precluding another server module on the upper stage, which is being horizontally extracted from the server enclosure.
Figure 9:
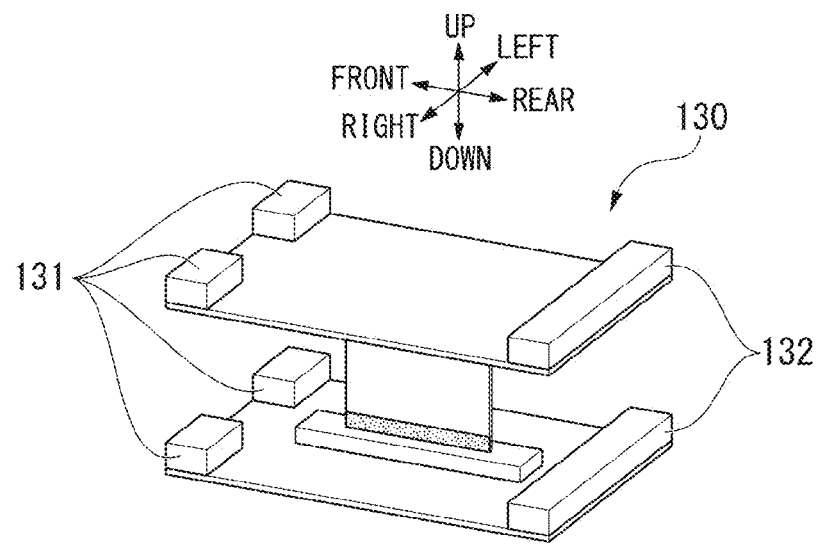
FIG. 9 is a perspective view of a power distribution unit attached to an enclosure element in the server enclosure.
Figure 10:
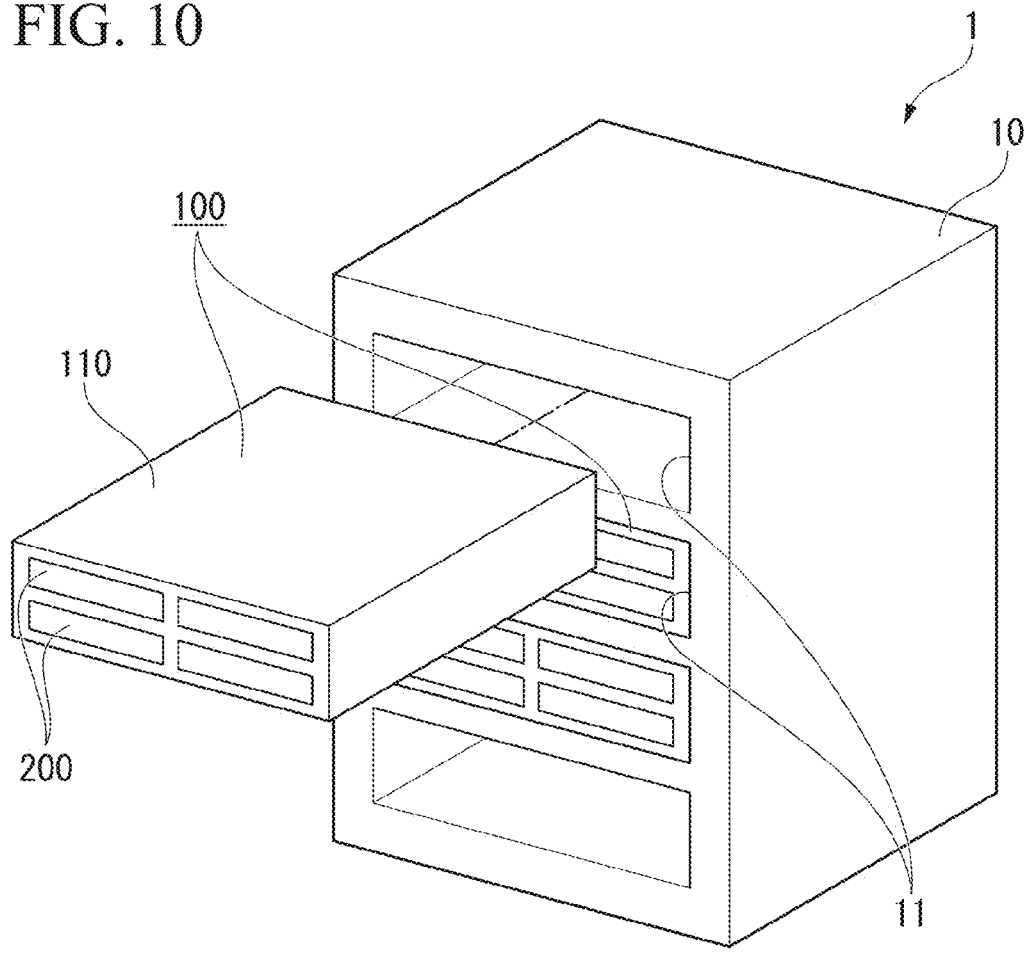
FIG. 10 is an exploded perspective view of a high-density server with a server rack in which the server enclosure is being inserted therein.

A second embodiment of the present invention will be described with reference to FIGS. 2 to 11, wherein parts identical to those of the first embodiment are indicated using the same reference signs in FIG. 1. FIG. 2 is a plan view of a server enclosure 100 accommodating a pair of server modules 200 mountable on a pair of front drawers 111 according to the second embodiment of the present invention. FIG. 3 is a plan view of the server enclosure 100 including one server module 200, in which another server module 200 is being horizontally extracted from the server enclosure 100. FIG. 4 is a plan view of the server enclosure 100 including a pair of server modules 200, in which one HDD unit is being extracted from one server module 200. FIG. 5 is a front view of the server enclosure 100 including two pairs of server modules 200 mounted on two pairs of front drawers 111 which are allocated to upper and lower stages vertically combined together. FIG. 6 is a rear view of the serve enclosure 100 including four server modules 200 mounted on four front drawers 111. FIG. 7 is a side view of the server enclosure 100 including a pair of server modules 200 mounted on a pair of front drawers 111 which are vertically combined together. FIG. 8 is a side view of the server enclosure 100 including one server module 200 on the lower stage with another server module 200 on the upper stage, which is being horizontally extracted from the server enclosure 100. FIG. 9 is a perspective view of a power distribution unit 130 attached to the enclosure element 120 of the server enclosure 100. FIG. 10 is an exploded perspective view of a high-density server 1 with a server rack 10 in which the server enclosure 100 is being inserted therein. FIGS. 11A and 11B are perspective views of power distribution units 140 applied to variations of server enclosures.

As shown in FIG. 10, a high-density server of the second embodiment includes a server rack 10 and a plurality of server enclosures 100. A plurality of enclosure drawers 11 is vertically aligned in the server rack 10 so as to individually store a plurality of server enclosures 100 therein in an insertable/removable manner. As shown in FIGS. 3 and 7, a structure including a pair of front drawers 111 and a rear opening 112 is repeatedly arranged horizontally or vertically; that is, a pair of structures is horizontally arranged as shown in FIG. 3, or a pair of structures is vertically arranged as shown in FIG. 7. In the enclosure frame 110, the front drawer 111 communicates with the rear opening 112 in the front-rear direction.

A single enclosure element 120 is located at the rear end inside a vertical pair of front drawers 111 or a horizontal pair of front drawers 111 in the enclosure frame 110. The enclosure element 120 includes a pair of power supply units 121 and a power distribution unit 130 serving as a single power connection mechanism. As shown in FIGS. 2 and 7, a pair of power supply units 121 arranged in the upper and lower stages is each located as the center in a horizontal direction in connection with a horizontal pair of front drawers 111 or a vertical pair of front drawers 111 in the enclosure frame 110. The power supply units 121 supply electrical power to the server modules 200 via the power distribution unit 130. As shown in FIGS. 2, 7, and 9, the power distribution unit 130 has an H-shaped structure (in a side view) in which two printed circuit boards (which are horizontally arranged and vertically distanced from each other) are connected together via another printed circuit board (which is vertically arranged between two printed circuit boards). The power distribution unit 130 includes two pairs of front connectors 131 (which are attached to the front ends of the two printed circuit boards respectively) and a pair of rear connectors 132 (which are attached to the rear ends of the two printed circuit boards). That is, the power distribution unit 130 implements redundant multiple connections using two pairs of front connectors 131 and a pair of rear connectors 132.

As shown in FIGS. 3 and 8, the server module 200 includes a module tray 201, four HDD units 210 (i.e. two pairs of HDD units 210 vertically combined together), an HDD connector 211, an operation panel 220, a plurality of cooling fans 230, a motherboard 202, a plurality of computer units 240, an optional unit 250, a wiring unit 260, and an external interface 270. The module tray 201 is formed in a flat shape which can be easily inserted into or pulled out from the front drawer 111 in the enclosure frame 110. A pair of module trays 201 is formed in a horizontally symmetrical manner in connection with a pair of server modules 200 which are horizontally coupled together. The aforementioned units 210 to 270 are mounted on the upper surface of the module tray 201. The four HDD units 210 are horizontally paired and located at the front end of the module tray 201. The HDD units 210 are detachably connected to the HDD connector 211 which is located in the rear side of the HDD units 210 and which is electrically connected to the wiring unit 260.

The operation panel 220 is located at one side of the HDD units 210 and connected to the foregoing units (not shown). Four cooling fans 230 are horizontally aligned in the rear side of the HDD connector 211. The motherboard 202 is configured of a printed circuit board for mounting a plurality of computer units 240, an optional unit 250, a wiring unit 260, and an external interface 270 thereon. A pair of motherboards 202 having the same structure is included in a pair of server modules 200 which are horizontally coupled together. The computer unit 240 is configured of a single-chip microcomputer including a CPU. The optional unit 250 may include a disk controller. The wiring unit 260 is located at a corner of a left-end center portion of the right-side server module 200 or at a corner of a right-end center portion of the left-side server module 200. The wiring unit 260 is electrically connected to the HDD connector 211 and the motherboard 202. The module connector 261, which is attached to the rear face of the wiring unit 260, is firmly supported by the module tray 201. Thus, it is possible to form both the motherboards 202, included in the left-side and right-side server modules 200, in the rectangular flat shape in common. When the server module 200 is mounted on the front drawer 111 of the enclosure frame 110, the module connector 261 of the wiring unit 260 is connected to one of the four front connectors 131 attached to the front end of the power distribution unit 130. When the server module 200 is mounted on the front drawer 111 of the enclosure frame 110, the external interface 270 is positioned in proximity to the rear opening 112. The external interface 270 includes an I/O port 271, a LAN connector 272, and a PCI slot 273. External wires (not shown) are detachably connected to the external interface 270 in the rear side of the server enclosure 100.

As shown in FIG. 10, the server rack 10 includes the four enclosure drawers 11 which are vertically aligned; hence, it is possible to mount the four server enclosures 100 on the four enclosure drawers 11 in an insertable/removable manner, thus assembling the high-density server 1 of the second embodiment. As shown in FIGS. 2 and 8, each serer enclosure 100 may mount two pairs of server modules 200 (which are paired horizontally and vertically) in an insertable/removable manner. The high-density server 1 is able to perform parallel processing with a plurality of server modules 200 installed therein, thus carrying out complex computation at a high speed.

As shown in FIGS. 3 and 8, the server enclosure 100 of the second embodiment is designed such that the module connector 261 of the server module 200, mounted on the front drawer 111 in an insertable/removable manner in the front-rear direction, is detachably connected to the front connector 131 of the enclosure element 120, which is located in the rear side of the front drawer 111 of the enclosure frame 110. This eliminates necessity of arranging the power supply unit 121 and the cooling fans 230 in proximity to the rear opening 112 of the server enclosure 100 while arranging the HDD units 210, the operation panel 220, the I/O port 271, and the external interface 270 in the front side of the server module 200. Therefore, the second embodiment prevents a plurality of external wires, connected to the external interface 270, from blocking users' access to the HDD units 210 and the operation panel 220 without a mess in the front face of the server enclosure 100. This makes it possible for users to perform maintenance work on the HDD units 210, which can be easily extracted from the server modules 200 installed in the enclosure frame 110 of the server enclosure 100 shown in FIG. 4.

The second embodiment does not need to install the power supply unit 121 in each server module 200 in the high-density server 1, thus preventing a reduction of the effective area in each server module 200. In other words, the second embodiment is able to share a single large-side power supply unit 121 with a plurality of server modules 200. In particular, as shown in FIGS. 2 and 9, the server enclosure 100 of the second embodiment is designed such that the enclosure element 120 is located at the center position, interposed between a pair of front drawers 111, in a horizontal direction, and therefore the server element 120 is shared by a pair of server modules 200 horizontally coupled together and a pair of server modules 200 vertically coupled together. Additionally, the power distribution unit 130 of the enclosure element 120 establishes redundant multiple connections between two pairs of server modules 200 (which are paired horizontally and vertically) and a pair of power supply units 121 vertically coupled together. For this reason, it is possible to prevent the server enclosure 100 from being totally downed irrespective of electrical failure which may occur in part of four server modules 200 or one of two power supply units 121. Moreover, the power supply unit 121 is positioned at the rear end of the enclosure frame 110 while the server module 200 is mounted on the front drawer 111 in the enclosure frame 110 in an insertable/removable manner. As shown in FIGS. 3 and 8, it is possible for users to easily extract the server module 200 from the server enclosure 100 and to carry out maintenance work on the "extracted" server module 200.

In the second embodiment, the rear opening 112 is formed in the rear face of the enclosure frame 110, while the external interface 270 of the enclosure element 120 is positioned in proximity to the rear opening 112, and therefore external wires are detachably connected to the external interface 270 in the rear side of the server enclosure 100. The second embodiment is designed to collectively aggregate external wires, which are connected to the server modules 200 installed in the server enclosure 100, in the rear side of the enclosure frame 110. Therefore, it is possible to reliably prevent external wires from hindering workability or maintenance work on the front face of the server enclosure 100. Additionally, it is possible to improve workability or maintenance work on the front face of the server enclosure 100 since the HDD units 210 and the operation panel 220 are arranged in proximity to the front side of the server module 200 which can be easily extracted in the front side of the server enclosure 100.

A pair of server modules 200 horizontally coupled together includes a pair of module trays 201 having symmetrical shapes, while a pair of motherboards 202 mounted on a pair of module trays 201 has the same layout for arranging the computer units 240 and the optional unit 250 thereon. In other words, it is possible to adopt the same type of motherboards 202, having the common layout for mounting the computer units 240 and the optional unit 250 thereon, in a pair of symmetrically-shaped server modules 200. This may improve productivity in producing high-density servers.

The second embodiment is not restrictive but illustrative, and therefore it is possible to prepare modifications and redesigns without departing from the essences of the present invention. For example, the power distribution unit 130 has a H-shaped structure (in a side view), as shown in FIGS. 2, 7, and 9, in which two printed circuit boards (which are horizontally aligned in parallel to each other) are connected together via another printed circuit board (which is vertically arranged and interposed between two printed circuit boards). It is possible to adopt a power distribution unit 140 as shown in FIGS. 11A and 11B instead of the power distribution unit 130. FIG. 11A shows the front side of the power distribution unit 140 in which two pairs of front connectors 141 (which are paired horizontally and vertically) are attached to the front face of a printed circuit board 143. FIG. 11B shows the rear side of the power distribution unit 140 in which a pair of rear connectors 142 (which are paired vertically) is attached to the rear face of the printed circuit board 143.

FIG. 10 shows the high-density server 1 in which four server enclosures 100 are mounted on four enclosure drawers 11 which are vertically aligned in the server rack 10. Naturally, it is possible to arbitrarily change the dimensions and layouts for the high-density server 1 within certain requirements and conditions of the second embodiment.

The second embodiment shows an example of the server module 200 in which all the HDD units 210, the HDD connector 211, the operation panel 220, the motherboard 202, the computer units 240, the optional unit 250, the wiring unit 260, and the external interface 270 are mounted on a single module tray 201. It is possible to divide the module tray 201 into front and rear portions, wherein the external interface 270 can be mounted on the rear portion of the module tray 201, which will be described below by way of a third embodiment of the present invention.

3. Third Embodiment

Figure 12:
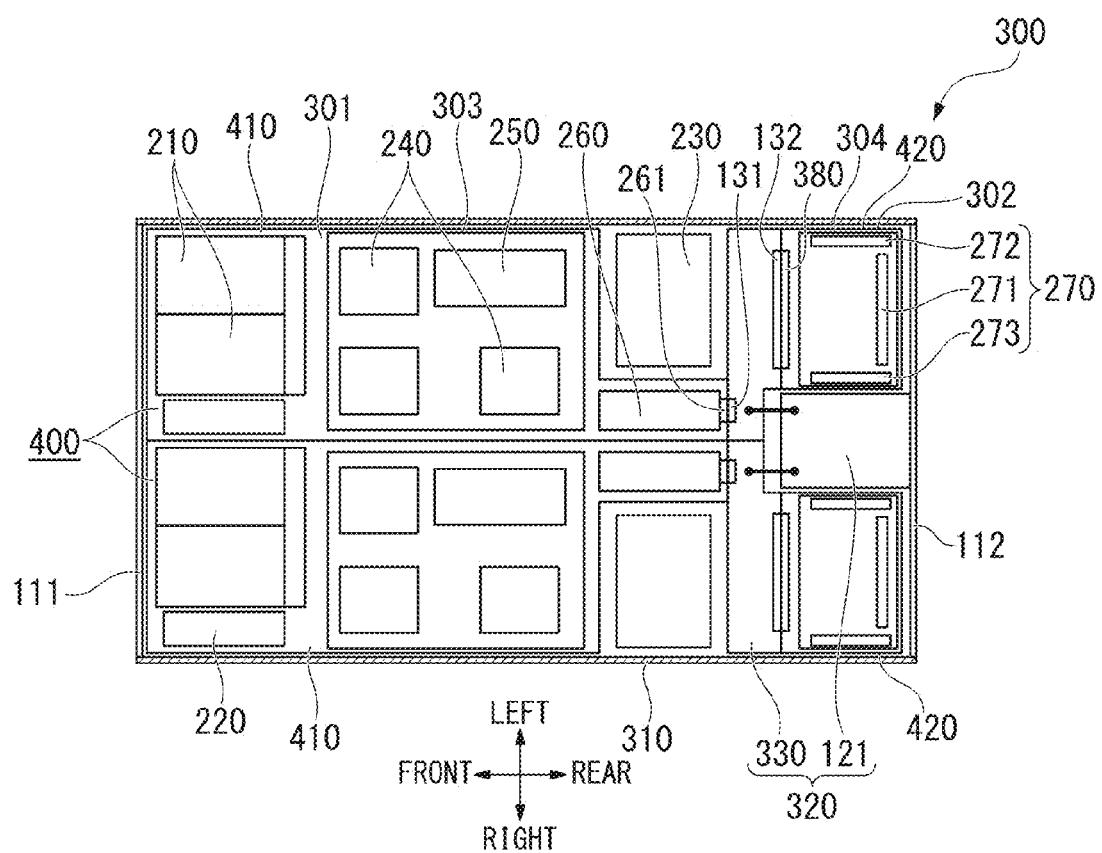
FIG. 12 is a plan view of a server enclosure including a pair of server modules mounted on a pair of front drawers according to a third embodiment of the present invention.
Figure 13:
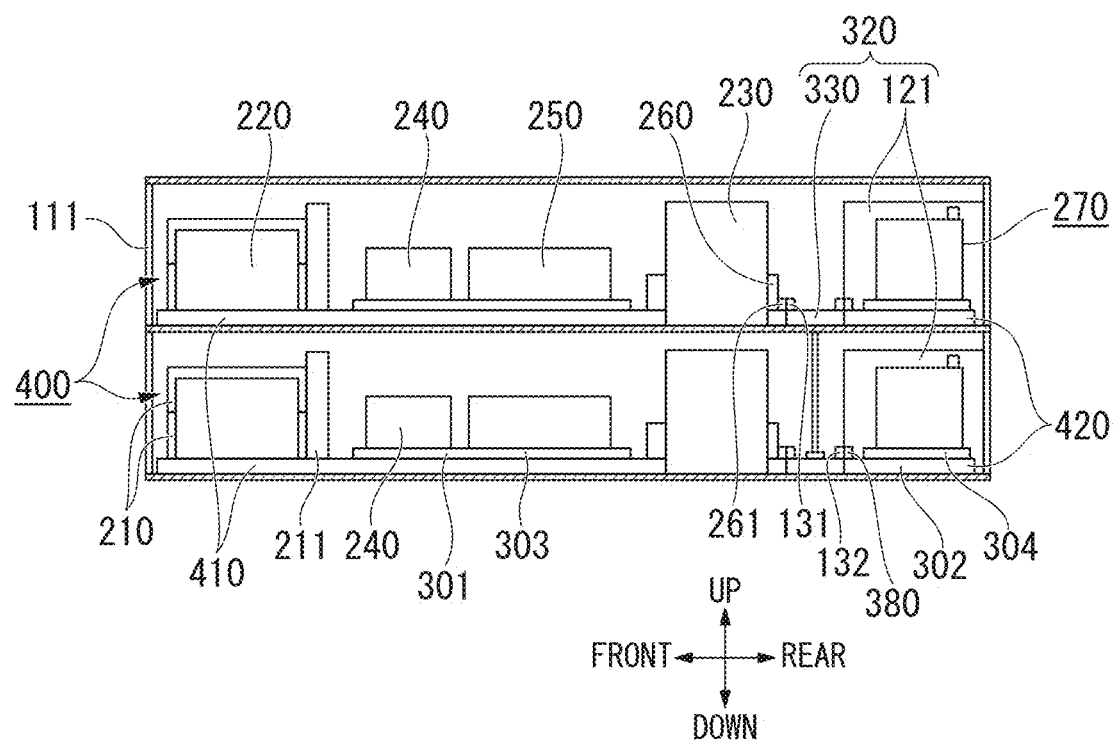
FIG. 13 is a side view of the server enclosure including a pair of server modules mounted on a pair of front drawers according to the third embodiment of the present invention.
Figure 14:
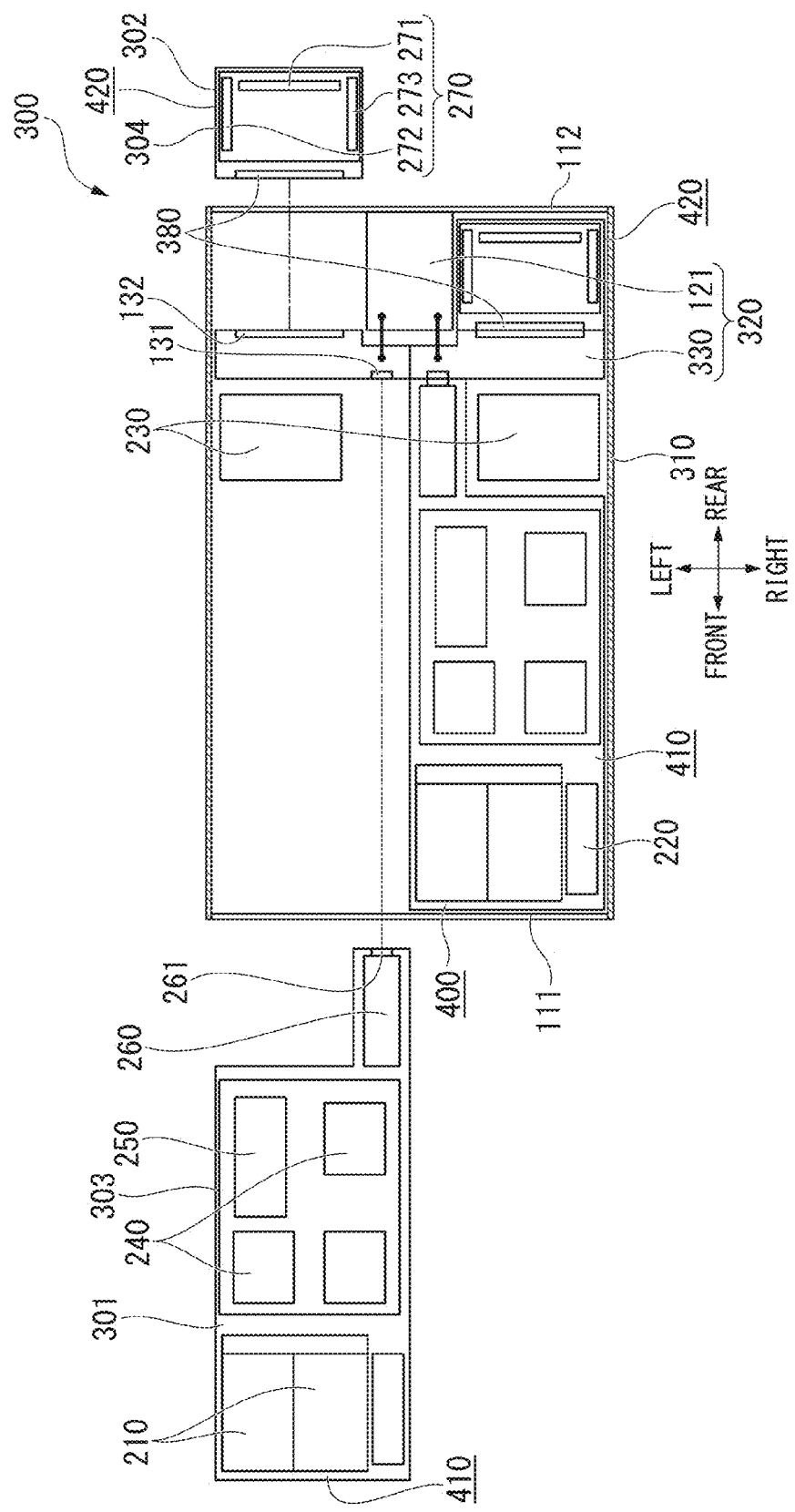
FIG. 14 is a plan view of the server enclosure including one server module with another server module, which is pulled out and divided into a main module and an interface module and horizontally extracted from the front and rear sides of the server module.
Figure 15:
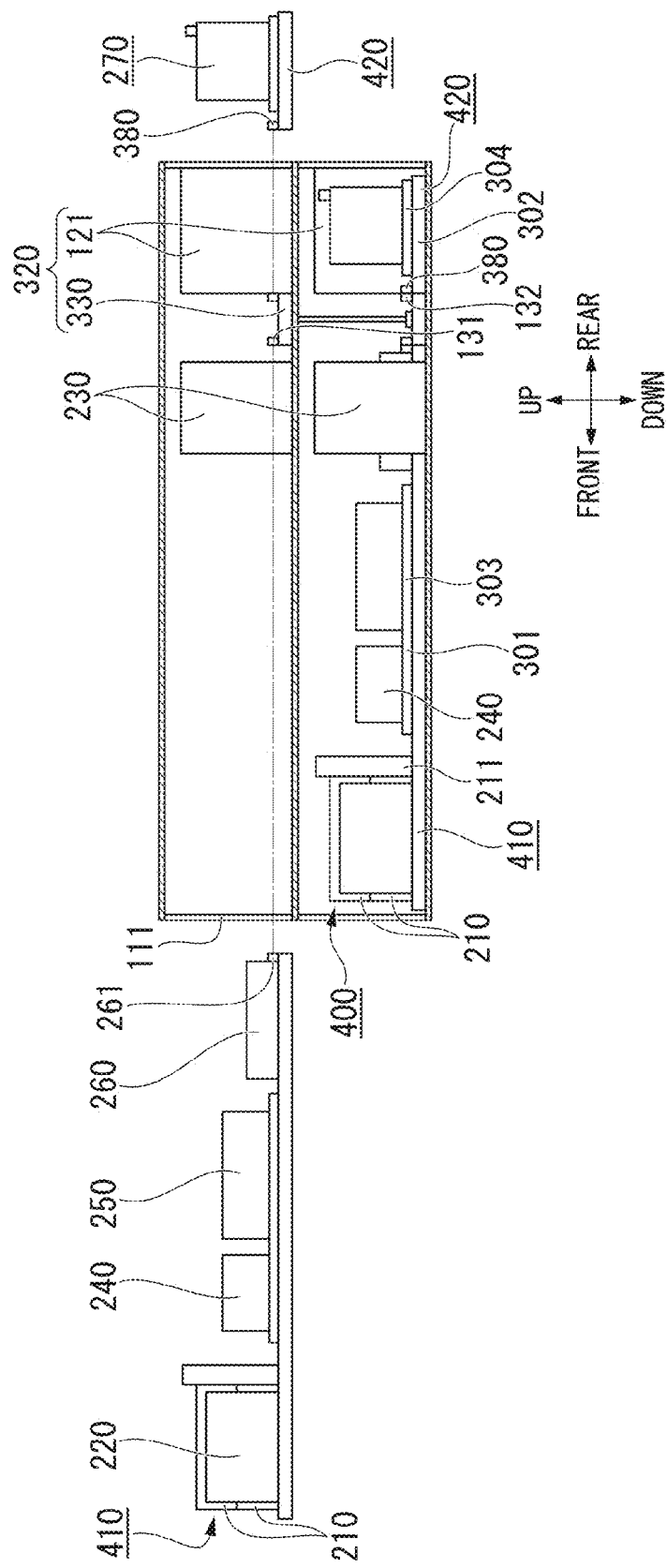
FIG. 15 is a side view of the server enclosure including one server module in the lower stage while precluding another server module, which is divided into a main module and an interface module and horizontally extracted from the front and rear sides in the upper stage of the server module.

A third embodiment of the present invention will be described with reference to FIGS. 12 to 15, wherein parts identical to those of the first and second embodiments are indicated using the same reference signs. FIG. 12 is a plan view of a server enclosure 300 including a pair of server modules 400 mounted on a pair of front drawers 111 (which are paired horizontally). FIG. 13 is a side view of the server enclosure 300 including a pair of server modules 400 mounted on a pair of front drawers 111 (which are paired vertically in the upper and lower stages). FIG. 14 is a plan view of the server enclosure 300 including one server module 400 with another server module 400, which is pulled out and divided into a main module 410 and an interface module 420 and horizontally extracted from the front and rear sides of the server module 300. FIG. 15 is a side view of the server enclosure 300 including one server module 400 in the lower stage while precluding another server module 400, which is divided into a main module 410 and an interface module 420 and horizontally extracted from the front and rear sides in the upper stage of the server module 300.

Similar to the second embodiment shown in FIG. 10, a high-density server according to the third embodiment can be prepared by installing a plurality of server enclosures 300 which are mounted in an insertable/removable manner on a plurality of enclosure drawers in a server rack (not shown). As shown in FIGS. 12 to 15, each server enclosure 300 includes two pairs of server modules 400 (which are horizontally and vertically paired) in an insertable/removable manner. The server enclosure 300 includes a single enclosure element 320, which is placed at a rear position interposed between a pair of horizontally-coupled front drawers 111 and a pair of vertically-coupled front drawers 111 in an enclosure frame 310. The enclosure element 320 includes two power supply units 121 (serving as power source units) and a single power distribution unit 330 (serving as a power connection mechanism). Each of the power supply units 121 is placed at a rear position interposed between a pair of horizontally-coupled front drawers 111 in each of the upper and lower stages of the enclosure frame 310. Two pairs of front connectors 131 (which are paired horizontally and vertically) are attached to the front side of the power distribution unit 330, while two pairs of rear connectors 132 (which are paired horizontally and vertically) are attached to the rear side of the power distribution unit 330. For this reason, the power distribution unit 330 establishes redundant multiple connections between two pairs of front connectors 131 and two pairs of rear connectors 132.

The server module 400 is divided into front and rear portions, i.e. the main module 410 and the interface module 420. The main module 410 includes a front-side module tray 301 while the interface module 420 includes a rear-side module tray 302. Four HDD units 210, an HDD connector 211, an operation panel 220, a front-side motherboard 303, a single large-size cooling fan 230, a plurality of computer units 240, an optional unit 250, and a wiring unit 260 are mounted on the front-side module tray 301 of the main module 410. The server module 400 of the third embodiment differs from the server module 200 in that a single large-size cooling fan 230 is mounted on the rear side of the front-side module tray 302 of the main module 410. However, it is possible to modify the server module 400 in a similar manner to the server module 200 such that a plurality of small-size cooling fans 230 is horizontally aligned in the rear side of the HDD unit 210. A rear-side motherboard 304, an external interface 270, and an interface connector 380 are mounted on the rear-side module tray 302 of the interface module 420. Additionally, the power supply units 121 are electrically connected to the power distribution unit 330 having rear connectors 132. The power distribution unit 330 differs from the power distribution unit 130 in that the rear connector 132 is not connected to the power supply unit 121 but detachably connected to the interface connector 380 of the rear-side module tray 302.

Similar to the high-density server 1 of the second embodiment, a high-density server according to the third embodiment can be prepared using a single rack server for mounting a plurality of server enclosures 300 in an insertable/removable manner, in which each server enclosure 300 may include two pairs of server modules 400 in an insertable/removable manner as shown in FIGS. 12 to 15. The high-density server of the third embodiment is able to carry out parallel processing with a plurality of server modules 400, thus performing complex computation at a high speed. In the server enclosure 300, the module connector 261 of the server module 400, which can be freely inserted into or pulled out from the front drawer 111 in the front-rear direction as shown in FIGS. 14 and 15, is detachably connected to the front connector 131 of the enclosure element 320 which is located in the rear side of the front drawer 111 in the enclosure frame 310. For this reason, the server enclosure 300 of the third embodiment does not need to arrange the power supply units 121 and the cooling fans 230 in proximity to the rear opening 112, which is needed in conventional server enclosures of high-density servers. Additionally, the server enclosure 300 does not need to arrange the HDD units 210, the operation panel 220, and the external interface 270 such as the I/O port 271 on the front face of the server module 400, which is needed in conventional server enclosures. Therefore, the third embodiment is able to prevent external wires, connected to the external interface 270, from hindering users' access to the HDD units 210 and the operation panel 220 without causing a mess in the front face of the server enclosure 300. Thus, the server enclosure 300 of the third embodiment allows users to easily carry out maintenance work on the HDD unit 210, which is extracted from the server module 400 installed in the enclosure frame 310.

Additionally, the server enclosure 300 of the third embodiment does not reduce the effective area of the server module 400 because the power supply units 121 are not individually arranged in connection with the server modules 400 in a high-density server. That is, the third embodiment adopts a small number of large-size power supply units 121 which are shared by a plurality of server modules 400 in common. In particular, the enclosure element 320 of the server enclosure 300 is located at a rear center position, interposed between a pair of front drawers 111 horizontally coupled together, and shared by two pairs of server modules 400 (which are paired horizontally and vertically). For this reason, the power distribution unit 330 of the enclosure element 320 establishes redundant multiple connections between two pairs of server modules 400 and two pairs of power supply units 121. Therefore, it is possible to prevent the server enclosure 300 from being totally downed irrespective of electrical failure which may occur in part of four server modules 400 or part of two power supply units 121.

The server enclosure 300 is designed such that the power supply units 121 are positioned in the rear side of the enclosure frame 310 while the main module 410 of the server module 400 is mounted on the front drawer 111 of the enclosure frame 310 in an insertable/removable manner. Additionally, the interface module 420 of the server module 400 is mounted in an insertable/removable manner in proximity to the rear opening 112 of the enclosure frame 310. This allows users to easily extract the main module 410 and the interface module 420 from the server enclosure 300 as shown in FIGS. 14 and 15, thus carrying out maintenance work on these modules. Moreover, the external interface 270 of the enclosure element 320 is positioned in proximity to the rear opening 112 which is formed in the rear face of the enclosure frame 310. This allows external wires to be detachably attached to the external interface 270 via the rear opening 112 of the enclosure frame 310 in the server enclosure 300. That is, it is possible to collectively aggregate external wires, which are connected to the external interface 270 of the server module 400 installed in the server enclosure 300, in the rear side of the enclosure frame 310. Therefore, it is possible to arrange the HDD units 210 and the operation panel 220 in proximity to the front face of the server module 300, and therefore it is possible to improve workability on the front face of the server enclosure 300 because users may easily extract the server modules 400 from the server enclosure 300. Additionally, it is possible to reliably prevent external wires from hindering users' workability on the front face of the server enclosure 300.

Lastly, the foregoing embodiments are illustrative and not restrictive; therefore, it is possible for any skilled person in the art to arbitrarily change design factors, dimensions, and arrangements with respect to the foregoing constituent elements. Thus, the present invention is not limited to the foregoing embodiments, which can be further modified in various ways within the scope of the invention as defined in the appended claims.

What is claimed is:

1. A server enclosure comprising:
   an enclosure frame having a front drawer, which further includes multiple pairs of left/right openings which are vertically combined together on a front face, and a rear opening which is opened on a rear face;
   a power supply unit positioned inside the enclosure frame;
   a front connector electrically conducting to at least the power supply unit;
   an enclosure element positioned at a rear end inside the front drawer of the enclosure frame which includes at least the power supply unit and in which the front connector is positioned in a front side;
   a computer unit which operates based on power supplied by the power supply unit;
   a module connector which electrically conducts to at least the computer unit and which is connected to the front connector in a freely-detachable manner;
   a server module which is equipped with at least the computer unit, which is equipped with the module connector at a rear side, and which is installed in the front drawer of the enclosure frame in a freely-insertable/extractable manner in a front-rear direction; and
   a plurality of cooling fans in close proximity to each other,
   wherein multiple pairs of left/right server modules are vertically placed and individually installed in the front drawer of the enclosure frame in a freely-insertable/extractable manner,
   wherein multiple pairs of left/right module connectors are vertically placed and individually installed in the vertically-placed multiple pairs of left/right server modules at their rear sides,
   wherein multiple pairs of left/right front connectors are vertically placed and positioned on the front face of the enclosure element,
   wherein the enclosure element is interposed between the vertically-placed multiple pairs of left/right server modules and shared by the vertically-placed multiple pairs of left/right server modules,
   wherein a plurality of power supply units is vertically combined together, and
   wherein the enclosure element includes a power connection mechanism establishing redundant multipoint-to-multipoint connections between the vertically-placed multiple pairs of rear connectors, which are connected to the vertically-placed multiple pairs of left/right power supply units in a freely-detachable manner, and the vertically-placed multiple pairs of front connectors,
   wherein the power connection mechanism comprises a pair of upper/lower printed circuit boards combined together using a single printed board vertically disposed therebetween.

2. The server enclosure according to claim 1, wherein the server module is equipped with an external interface, which is positioned at the rear opening of the enclosure frame and connected to an external wire in a freely-detachable manner rearwards, at a rear side.

3. The server enclosure according to claim 1, wherein the enclosure element includes an external interface, which is positioned at the rear opening of the enclosure frame and connected to an external wire in a freely-detachable manner rearwards.

4. The server enclosure according to claim 1, wherein the server module is divided into a main module and an interface module in connection with the enclosure element,
   wherein the main module has a rear connector, and
   wherein the interface module includes an external interface, which is positioned in proximity to the rear opening of the enclosure frame, and an interface connector, which is electrically connected to the external interface and detachably connected to the rear connector of the main module.

5. The server enclosure according to claim 1, wherein the enclosure element includes a pair of power supply units, a pair of front connectors, a pair of rear connectors, and the power connection mechanism establishes redundant multiple connections between the pair of front connectors and the pair of rear connectors.

6. The server enclosure according to claim 1, wherein the pair of front drawers are vertically coupled together in the enclosure frame,
wherein the pair of server modules is vertically coupled together and mounted on the pair of front drawers, and
wherein the enclosure element is interposed between the pair of front drawers vertically coupled together.

7. The server enclosure according to claim 6, wherein the enclosure element includes a pair of power supply units vertically coupled together, a pair of front connectors vertically coupled together, a pair of rear connectors vertically coupled together, and the power connection mechanism establishes redundant multiple connections between the pair of front connectors and the pair of rear connectors.

8. The server enclosure according to claim 1, wherein each of the pair of server modules further includes a wiring unit for supporting the module connector.

9. A server module adapted to a server enclosure according to claim 1, comprising:
a computer unit which operates based on power supplied by the supply unit; and
a module connector which electrically conducts to at least the computer unit and which is connected to the front connector in a freely-detachable manner,
wherein the server module which installs at least the computer unit thereon and which is equipped with the module connector in a rear side is installed in the front drawer of the enclosure frame in a freely-insertable/extractable manner in a front-rear direction.

10. The server module according to claim 9, further comprising an external interface which is positioned at the rear opening of the enclosure frame and connected to an external wire in a freely-detachable manner rearwards.

11. The server module according to claim 9, further comprising an interface module in connection with the enclosure element, wherein the interface module includes an external interface, which is positioned in proximity to the rear opening of the enclosure frame, and an interface connector, which is electrically connected to the external interface and detachably connected to the rear connector.

12. The enclosure element according to claim 1, further comprising an external interface which is positioned at the rear opening of the enclosure frame and connected to an external wire in a freely-detachable manner rearwards.

13. The enclosure element according to claim 1, adapted to the server enclosure including a pair of server modules mounted on a pair of front drawers inside the enclosure frame, comprising:
a pair of power supply units;
a pair of front connectors;
a pair of rear connectors; and
the power connection mechanism establishes redundant multiple connections between the pair of front connectors and the pair of rear connectors in connection with the pair of power supply units.

14. The enclosure element according to claim 1, adapted to the server enclosure including a pair of server modules mounted on a pair of front drawers, vertically coupled together, inside the enclosure frame, comprising:
a pair of power supply units vertically coupled together;
a pair of front connectors vertically coupled together;
a pair of rear connectors vertically coupled together; and
the power connection mechanism establishes redundant multiple connections between the pair of front connectors and the pair of rear connectors in connection with the pair of power supply units.

15. The server enclosure according to claim 1,
wherein the server module includes a mother board, installing at least the computer unit thereon, a wiring unit supporting the module connector, and
wherein the wiring unit electrically conducts to the mother board.

16. The server enclosure according to any one of claim 1, wherein one of the plurality of cooling fans is placed in a front side of the rear opening and inside the enclosure frame installing at least the server module therein.

17. The server enclosure according to claim 16, wherein one of the plurality of cooling fans is installed in the server module.

18. A high-density server comprising:
a plurality of server enclosures, at least one of the plurality of server enclosures comprising:
an enclosure frame including a front drawer, which further includes multiple pairs of left/right openings which are vertically combined together on a front face, and a rear opening which is opened on a rear face;
a power supply unit positioned inside the enclosure frame;
a front connector electrically conducting to at least the power supply unit;
an enclosure element positioned at a rear end inside the front drawer of the enclosure frame which includes at least the power supply unit and in which the front connector is positioned in a front side;
a computer unit which operates based on power supplied by the power supply unit;
a module connector which electrically conducts to at least the computer unit and which is connected to the front connector in a freely-detachable manner;
a server module which is equipped with at least the computer unit, which is equipped with the module connector at a rear side, and which is installed in the front drawer of the enclosure frame in a freely-insertable/extractable manner in a front-rear direction; and
a plurality of cooling fans in close proximity to each other; and
a server rack including a plurality of enclosure drawers installing the plurality of server enclosures in a freely-insertable/extractable manner,
wherein multiple pairs of left/right server modules are vertically placed and individually installed in the front drawer of the enclosure frame in a freely-insertable/extractable manner,
wherein multiple pairs of left/right module connectors are vertically placed and individually installed in the vertically-placed multiple pairs of left/right server modules at their rear sides,
wherein multiple pairs of left/right front connectors are vertically placed and positioned on the front face of the enclosure element,
wherein the enclosure element is interposed between the vertically-placed multiple pairs of left/right server modules and shared by the vertically-placed multiple pairs of left/right server modules,
wherein a plurality of power supply units is vertically combined together, and
wherein the enclosure element includes a power connection mechanism establishing redundant multipoint-to-multipoint connections between the vertically-placed multiple pairs of rear connectors, which are connected to the vertically-placed multiple pairs of left/right power supply units in a freely-detachable manner, and the vertically-placed multiple pairs of front connectors,
wherein the power connection mechanism comprises a pair of upper/lower printed circuit boards combined together using a single printed board vertically disposed therebetween.

19. The high-density server according to claim 18, wherein the enclosure element includes an external interface, which is positioned at the rear opening of the enclosure frame and connected to an external wire in a freely-detachable manner rearwards.

20. The high-density server according to claim 18, wherein the enclosure element includes
a pair of power supply units,
a pair of front connectors,
a pair of rear connectors, and
the power connection mechanism establishes redundant multiple connections between the pair of front connectors and the pair of rear connectors in connection with the pair of power supply units.

* * * * *